(12) United States Patent
Komoriya

(10) Patent No.: US 6,356,095 B1
(45) Date of Patent: Mar. 12, 2002

(54) SEMICONDUCTOR INTEGRATED CIRCUIT

(75) Inventor: Hirokazu Komoriya, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/649,081

(22) Filed: Aug. 28, 2000

(30) Foreign Application Priority Data

Mar. 22, 2000 (JP) ....................................... 2000-080739

(51) Int. Cl.$^7$ ............................................. G01R 31/28
(52) U.S. Cl. ...................................... 324/763; 324/765
(58) Field of Search ................................. 324/763, 537, 324/765; 714/733, 734; 257/48; 438/17

(56) References Cited

U.S. PATENT DOCUMENTS

| | | | |
|---|---|---|---|
| 5,241,266 A | * 8/1993 | Ahmad et al. | 714/733 |
| 5,399,505 A | * 3/1995 | Dasse et al. | 438/17 |
| 5,648,661 A | * 7/1997 | Rostoker et al. | 257/48 |
| 6,046,600 A | * 4/2000 | Whetsel | 324/763 |

FOREIGN PATENT DOCUMENTS

| | | |
|---|---|---|
| JP | 5-36774 | 2/1993 |
| JP | 6-45447 | 2/1994 |

* cited by examiner

*Primary Examiner*—Ernest Karlsen
(74) *Attorney, Agent, or Firm*—Burns, Doane, Swecker & Mathis, LLP

(57) ABSTRACT

A plurality of for-wafer-test input/output elements exclusively used in a wafer test are arranged with a plurality of input/output ports corresponding to a plurality of internal circuits in a semiconductor integrated circuit. In the wafer test, a probe is connected with each for-wafer-test input/output element, input test signals are input from an external apparatus to the input/output ports through one for-wafer-test input/output element connected with the probe and are sent to the internal circuits. Thereafter, output test signals obtained in the internal circuits are read out to the input/output ports and are output from the input/output ports to another external apparatus through another for-wafer-test input/output element connected with the probe, so that functions of the internal circuits can be checked. Because no probe is connected with each input/output port in the wafer test, no physical damage is given to each input/output port in the wafer test, so that each input/output port can be connected with a bonding wire in an normal operation without any connection failure. Also, because the addition of one for-wafer-test input/output element for each input/output port is not adopted, the increase of the size of the semiconductor integrated circuit can be suppressed at a minimum.

8 Claims, 8 Drawing Sheets

SO-OUT FROM OUTPUT BUFFER 33

SEMICONDUCTOR INTEGRATED CIRCUIT

BACKGROUND OF THE INVENTION

1. Field of the Invention

The present invention relates to a semiconductor integrated circuit in which a wafer test is performed to check functions of a plurality of input/output ports connected with a plurality of internal circuits.

2. Description of Related Art

FIG. 10 is a diagram showing a positional relationship among an internal circuit area and a plurality of input/output ports arranged around the internal circuit area in a conventional semiconductor integrated circuit. In FIG. 10, 101 indicates a rectangular-shaped semiconductor chip on which a conventional semiconductor integrated circuit is arranged, and 105 indicates a rectangular-shaped internal circuit area arranged in a central portion of the conventional semiconductor integrated circuit. A plurality of internal circuits such as logical circuits and an electric power supply circuit are arranged in the internal circuit area 105. 104 indicates a plurality of input/output (I/O) ports, arranged on the four outer circumferential sides of the rectangular-shaped internal circuit area 105, for respectively inputting external data to the corresponding internal circuit and outputting internal data produced in the corresponding internal circuit to the outside. Each input/output port 104 is composed of a wire-bonding pad (hereinafter, called a pad) 103 and a buffer 102. Each pad 103 is connected with a bonding wire (not shown) in an normal operation to input or output data from/to an external apparatus (not shown) through the bonding wire. 106 indicates a probe. The probe 106 is connected with the pad 103 of each input/output port 104 in a wafer test. In the wafer test, an input test signal, an output test signal, various control signals and a voltage signal are transmitted between the probe 106 and each input/output port 104 to check a function of the corresponding internal circuit connected with the input/output port 104.

An operation of the conventional semiconductor integrated circuit is described.

To check the function of each internal circuit (for example, each logical circuit) arranged in the internal circuit area 105 in the wafer test, the probe 106 is connected with the pad 103 of the input/output port 104 corresponding to the internal circuit, and the wafer test is performed. That is, an input test signal and various control signals supplied from the probe 106 are input to the internal circuit through the pad 103 and the buffer 102 of the input/output port 104, and an output test signal produced in the internal circuit is output to the probe 106 through the input/output port 104. Also, a voltage signal supplied from the probe 106 is input to a specific input/output port 104 used for the electric power supply to supply an electric power to the corresponding internal circuit.

However, because the probe 106 is connected with each of the pads 103 of the input/output ports 104 in the wafer test to check the functions of the internal circuits, there is a case where one pad 103 is damaged in the connection of the probe 106 with the pad 103. In this case, even though a bonding wire is connected with the pad 103 in an normal operation, there is a problem that a contact failure occurs between the bonding wire and the pad 103 because the bonding wire is not electrically connected with the pad 103.

Also, there is another conventional semiconductor integrated circuit in which a for-wafer-test pad exclusively used for the wafer test is additionally arranged for each input/output port 104. In this conventional semiconductor integrated circuit, because a probe is connected with the for-wafer-test pad in the wafer test, the bonding wire can be reliably connected with the pad 103 in the normal operation without any connection failure. However, because a large number of input/output ports 104 are usually arranged in the conventional semiconductor integrated circuit, a large number of for-wafer-test pads are required, so that the size of the conventional semiconductor integrated circuit is considerably increased.

SUMMARY OF THE INVENTION

An object of the present invention is to provide, with due consideration to the drawbacks of the conventional semiconductor integrated circuit, a semiconductor integrated circuit in which the occurrence of a contact failure between a bonding wire and a pad is prevented in the connection of the bonding wire with the pad in a normal operation performed after a wafer test while suppressing the increase of the size of the semiconductor integrated circuit having internal circuits.

The object is achieved by the provision of a semiconductor integrated circuit comprising a first for-wafer-test input/output element, exclusively used for a wafer test, for outputting a plurality of test signals to be used in the wafer test; a second for-wafer-test input/output element, exclusively used for the wafer test, for outputting a control signal to be used in the wafer test; a third for-wafer-test input/output element, exclusively used for a wafer test, for receiving the test signals used in the wafer test; and a plurality of input/output ports, which each correspond to an internal circuit and are serially arranged for a flow of the test signals output from the first for-wafer-test input/output element, for receiving the test signals serially output from the first for-wafer-test input/output element, outputting the test signals to the corresponding internal circuits according to the control signal received from the second for-wafer-test input/output element, reading out the test signals from the corresponding internal circuits according to the control signal and serially transferring the test signals to the third for-wafer-test input/output element according to the control signal.

In the above configuration, when the test signals are output to the corresponding internal circuits, a logical calculation or the like is performed for the test signal in each internal circuit to produce the test signal as a result of the logical calculation. Therefore, functions of the internal circuits can be checked in the wafer test by analyzing the test signals read out from the internal circuits. Also, because the test signals and the control signals are sent from the outside to the input/output ports through the first and second for-wafer-test input/output elements and because the test signals processed in the internal circuits are sent from the input/output ports to the outside through the third for-wafer-test input/output element, though a probe is connected with each for-wafer-test input/output element in the wafer test, no probe is connected with each input/output port in the wafer test.

Accordingly, each input/output port is not physically damaged in the wafer test, so that a bonding wire can be connected with each input/output port in a normal operation performed after the wafer test without any contact failure between the bonding wire and each input/output port. Therefore, the yield of the semiconductor integrated circuit can be improved.

Also, because the first, second and third for-wafer-test input/output elements are arranged in a set for all the input/output ports, the increase of the size of the semiconductor integrated circuit can be suppressed as compared with a case where one for-wafer-test input/output element is arranged for each input/output port.

It is preferred that each input/output port comprises a first shift register, the test signals serially output from the first for-wafer-test input/output element are held in the first shift registers of the input/output ports, the test signals held in the first shift registers are output to the corresponding internal circuits according to the control signal received from the second for-wafer-test input/output element, the test signals readout from the corresponding internal circuits according to the control signal are held in the first shift registers, and the test signals held in the first shift registers are transferred to the third for-wafer-test input/output element according to the control signal.

In the above configuration, the test signals are transmitted to the first shift registers, the internal circuits and the first shift registers in that order. therefore, the configuration of each input/output port required for the wafer test can be simplified.

It is also preferred that the semiconductor integrated circuit further comprises a fourth for-wafer-test input/output element for outputting a voltage control signal; and a fifth for-wafer-test input/output element for receiving an output voltage signal, wherein a specific input/output port selected from the input/output ports comprises a pad to which a voltage is applied; and a second shift register for holding the voltage control signal output from the fourth for-wafer-test input/output element in the wafer test according to the control signal received from the second for-wafer-test input/output element to transfer the output voltage signal indicating a value of the voltage applied to the pad to the fifth for-wafer-test input/output element according to the voltage control signal held in the second shift register.

In the above configuration, a voltage is applied to the pad in the wafer test, the voltage control signal output from the fourth for-wafer-test input/output element is held in the second shift register in the wafer test, and the value of the voltage applied to the pad is transferred to the fifth for-wafer-test input/output element according to the voltage control signal. Therefore, the voltage applied to the pad can be detected in the wafer test before the voltage is sent to the corresponding internal circuit in the normal operation.

It is also preferred that a frequency of a particular test signal, which is selected from the test signals and is output to a particular internal circuit corresponding to a particular input/output port selected from the input/output ports, is higher than that of the other test signals output to the internal circuits other than the particular internal circuit, the particular test signal is sent to the particular input/output port separately from the other test signals serially sent from the first for-wafer-test input/output element to the input/output ports other than the particular input/output port, and the particular input/output port comprises a for-wafer-test pad, exclusively used for a wafer test, for receiving the particular test signal in the wafer test; and a selector for selecting the particular test signal received by the for-wafer-test pad or an operation signal according to the control signal received from the second for-wafer-test input/output element to output the particular test signal to the particular internal circuit in the wafer test and to output the operation signal to the particular internal circuit in a normal operation.

In the above configuration, in cases where the particular test signal, of which the frequency is higher than that of the other test signals, is required in the particular internal circuit because the frequency of the operation signal to be processed in the particular internal circuit is higher than that of the other test signals, the particular test signal is sent to the for-wafer-test pad of the particular input/output port separately from the other test signals serially sent to the other input/output ports. Thereafter, in case of the wafer test, the particular test signal is selected by the selector and is output to the particular internal circuit. Also, in case of the normal operation, the operation signal is selected by the selector and is output to the particular internal circuit.

Accordingly, because a probe is connected with the for-wafer-test pad in the wafer test, in cases where a bonding wire is connected with the particular input/output port in the normal operation, no connection failure between the particular input/output port and the bonding wire occurs in the normal operation.

Also, because the particular test signal is sent to the particular input/output port separately from the other test signals serially sent to the other input/output ports, it is not required to reset an entire test pattern of the test signals including the particular test signal, so that a time required for the wafer test can be shortened.

It is also preferred that the semiconductor integrated circuit further comprises a fourth for-wafer-test input/output element, exclusively used for the wafer test, for outputting a plurality of second test signals of which the frequency is higher than that of the test signals output from the first for-wafer-test input/output element; a fifth for-wafer-test input/output element, exclusively used for the wafer test, for outputting a second control signal; and a sixth for-wafer-test input/output element, exclusively used for the wafer test, for receiving the second test signals used in the wafer test, wherein the frequency of particular signals, which are required in one or more particular internal circuits selected from the internal circuits, is higher than that of signals required in internal circuits other than the particular internal circuits, the second test signals serially output from the fourth for-wafer-test input/output element are received by one or more particular input/output ports corresponding to the particular internal circuits in place of the test signals serially output from the first for-wafer-test input/output element, the second test signals are output to the particular internal circuits according to the second control signal received from the fifth for-wafer-test input/output element, the second test signals are read out from the particular internal circuits according to the second control signal, and the second test signals are serially transferred to the sixth for-wafer-test input/output element according to the second control signal.

In the above configuration, in cases where the frequency of particular signals required in the particular internal circuits is higher than that of signals required in the other internal circuits, the wafer test of the particular internal circuits is performed, in the same manner as the wafer test of the other internal circuits, by using the set of fourth, fifth and sixth for-wafer-test input/output elements.

Accordingly, even though the frequency of particular signals required in the particular internal circuits is higher than that of signals required in the other internal circuits, because the wafer test of the particular internal circuits can be performed separately from the wafer test of the other internal circuits, a time required for the wafer tests of all the internal circuits can be shortened. Also, the number of test patterns required for the wafer tests of all the internal circuits can be reduced, and a transfer time of the test signals serially sent to the input/output ports other than the particular input/output ports can be shortened as compared with that of the test signals serially sent to all the input/output ports.

It is also preferred that the internal circuits corresponding to the input/output ports are arranged in a central area of the semiconductor integrated circuit, and the first for-wafer-test input/output element and the second for-wafer-test input/output element are arranged on one or more corners of the semiconductor integrated circuit.

The input/output ports are arranged on outer circumferential sides of an internal circuit area, in which the internal circuits are arranged, because each input/output port has an output buffer. In contrast, because each of the first and second for-wafer-test input/output elements has no output buffer, a size of each of the first and second for-wafer-test input/output elements is smaller than those of the input/output ports. Therefore, the first and second for-wafer-test input/output elements can be arranged on one or more corners of the semiconductor integrated circuit.

Accordingly, the size of the semiconductor integrated circuit can be made small.

It is also preferred that a specific input/output port arranged in the final stage among the input/output ports, which are serially arranged for the flow of the test signals serially output from the first for-wafer-test input/output element, has an output buffer required in the third for-wafer-test input/output element while removing the output buffer from the third for-wafer-test input/output element, the internal circuits corresponding to the input/output ports are arranged in a central area of the semiconductor integrated circuit, and the third for-wafer-test input/output element is arranged on a corner of the semiconductor integrated circuit.

Because the output buffer of the third for-wafer-test input/output element is removed and arranged in the specific input/output port arranged in the final stage among the input/output ports, the size of-the third for-wafer-test input/output element is made small on condition that the test signals processed in the internal circuits are smoothly output to the third for-wafer-test input/output element. Therefore, the third for-wafer-test input/output element can be arranged on the corner of the semiconductor integrated circuit, and the size of the semiconductor integrated circuit can be made small.

It is also preferred that the semiconductor integrated circuit further comprises a for-electric-power-supply input/output port for supplying an electric power to the input/output ports, the internal circuits corresponding to the input/output ports are arranged in a central area of the semiconductor integrated circuit, and the for-electric-power-supply input/output port is arranged on a corner of the semiconductor integrated circuit.

Because the for-electric-power-supply input/output port has only a for-electric-power-supply pad, the for-electric-power-supply input/output port can be arranged on one corner of the semiconductor integrated circuit. Therefore, even though the for-electric-power-supply input/output port is added to the semiconductor integrated circuit, the increase of the size of the semiconductor integrated circuit can be suppressed.

DETAILED DESCRIPTION OF THE PREFERRED EMBODIMENTS

The invention will now be described with reference to the accompanying drawings.

EMBODIMENT 1

Figure 1:
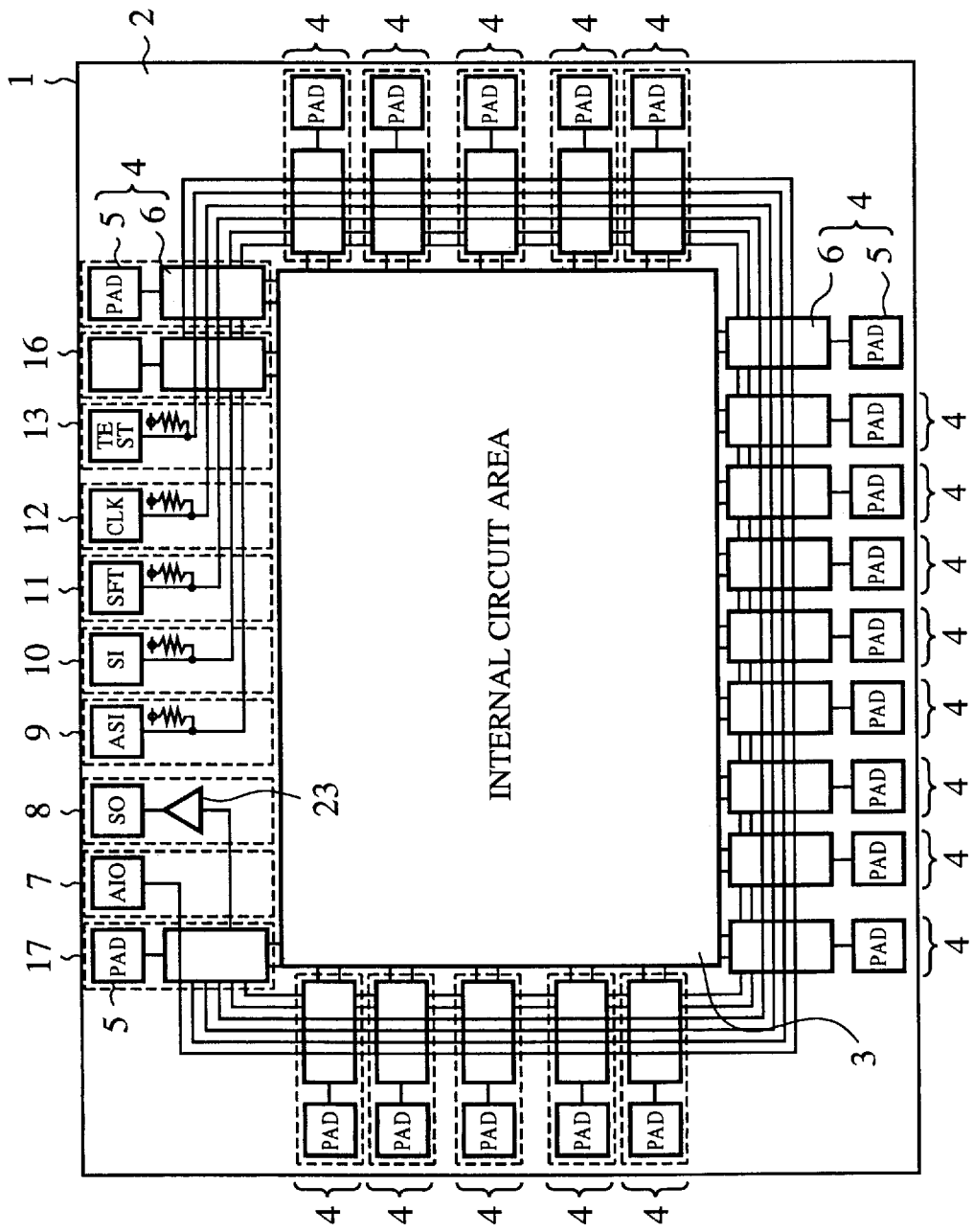
FIG. 1 is a diagram showing a positional relationship among an internal circuit area, a plurality of input/output ports arranged around the internal circuit area and a plurality of for-wafer-test input/output elements arranged around the internal circuit area in a semiconductor integrated circuit according to a first embodiment of the present invention.

FIG. 1 is a diagram showing a positional relationship among an internal circuit area, a plurality of input/output ports arranged around the internal circuit area and a plurality of for-wafer-test input/output elements arranged around the internal circuit area according to a first embodiment of the present invention. In FIG. 1, 1 indicates a rectangular-shaped semiconductor chip on which a semiconductor integrated circuit is arranged, 3 indicates a rectangular-shaped internal circuit area placed in a central portion of the semiconductor integrated circuit, and 2 indicates an input/output port area placed around the internal circuit area 3. A plurality of internal circuits such as logical circuits (not shown) are arranged in the internal circuit area 3. 4 indicates a plurality of input/output (I/O) ports which are arranged in the input/output port area 2 and are placed on the four outer circumferential sides of the internal circuit area 3. Each input/output port 4 is connected with the corresponding internal circuit of the internal circuit area 3. Each input/output port 4 is composed of a bonding wire pad (hereinafter, called a pad) 5 and an output buffer 6. 16 indicates an input/output port which is arranged in the input/output port area 2 and is connected with the corresponding internal circuit of the internal circuit area 3, and 17 indicates an input/output port which is arranged in the input/output port area 2 and is connected with the corresponding internal circuit of the internal circuit area 3. A serial chain is formed of the input/output port 16 (arranged in the first stage), the input/output ports 4 and the input/output port 17 (arranged in the final stage). A data input/output operation is performed in a normal operation between an external apparatus (not shown) and the internal circuit corresponding to each of the input/output ports 4, 16 and 17 through a bonding wire (not shown) connected with the pad 5 of the input/output port 4, 16 or 17, the pad 5 and the output buffer 6 of the input/output port 4, 16 or 17.

Also, 13 indicates a for-wafer-test input/output element which is arranged on one outer circumferential side of the internal circuit area 3 and is exclusively used in a wafer test to input a for-wafer-test control signal TEST to each of the input/output ports 4, 16 and 17. When the for-wafer-test control signal TEST is input to the input/output ports 4, 16 and 17 through the for-wafer-test input/output element 13, the semiconductor integrated circuit is set to the wafer test state. 10 indicates a for-wafer-test input/output element which is arranged on one outer circumferential side of the internal circuit area 3 and is exclusively used in the wafer test to serially input a plurality of test signals SI to the input/output ports 16, 4 and 17 which are serially arranged in that order as the serial chain for a flow line of the test signals SI. 11 indicates a for-wafer-test input/output element which is arranged on one outer circumferential side of the internal circuit area 3 and is exclusively used in the wafer test to input a shift clock signal SFT to each of the input/output ports 4, 16 and 17. 12 indicates a for-wafer-test input/output element which is arranged on one outer circumferential side of the internal circuit area 3 and is exclusively used in the wafer test to input a clock signal CLK to each of the input/output ports 4, 16 and 17. 9 indicates a for-wafer-test input/output element which is arranged on one outer circumferential side of the internal circuit area 3 and is exclusively used in the wafer test to serially input a plurality of voltage control signals ASI to the input/output ports 16, 4 and 17 which are serially arranged in that order as the serial chain for a flow line of the voltage control signals ASI.

Figure 2:
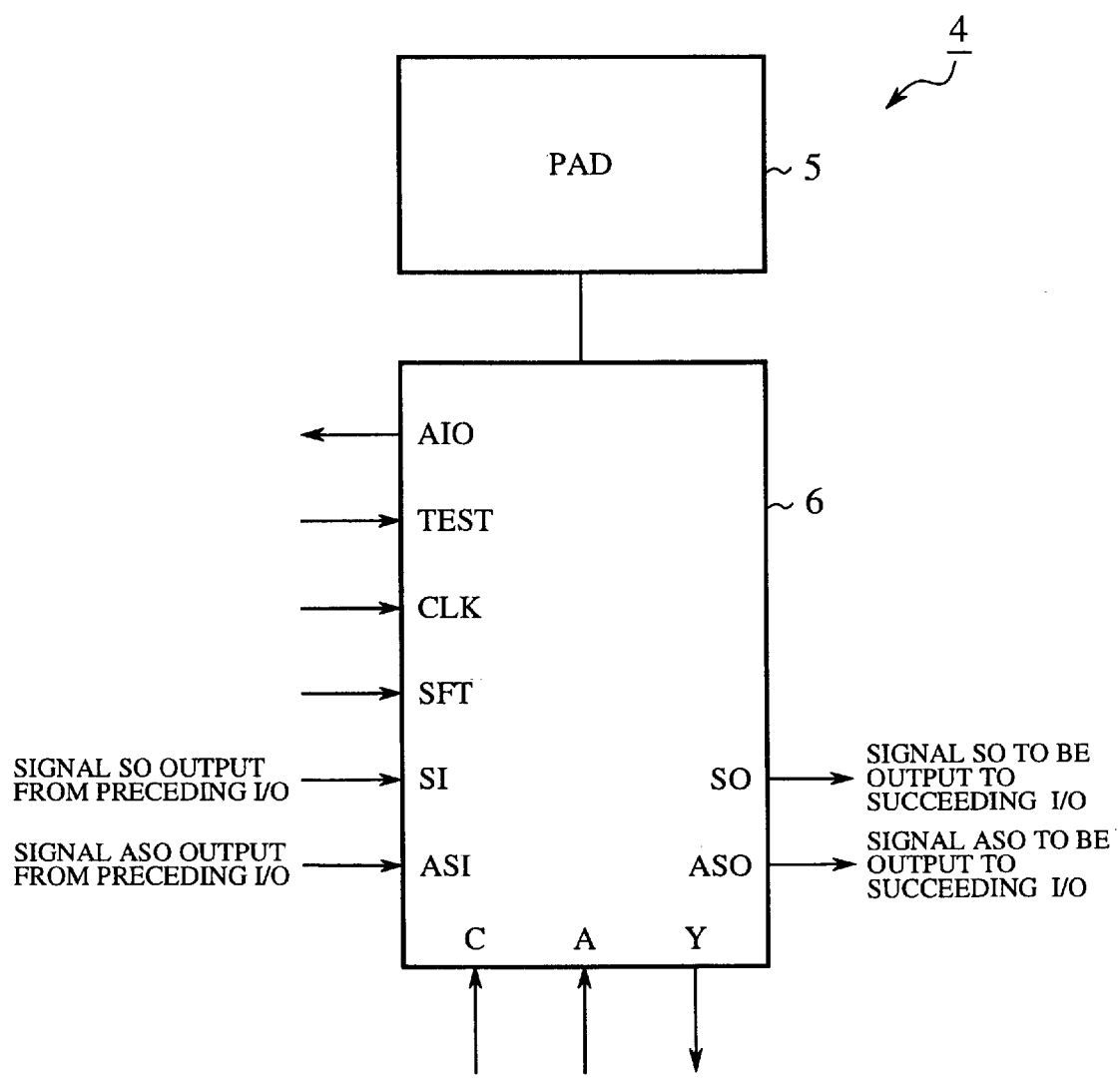
FIG. 2 shows signals input to an output buffer of each input/output port shown in FIG. 1 and signals output from the output buffer.

FIG. 2 shows signals input to the output buffer 6 of each input/output port 4 shown in FIG. 1 and signals output from the output buffer 6. When the input test signal SI (or the voltage control signal ASI) is repeatedly input from the for-wafer-test input/output element 10 (or the for-wafer-test input/output element 9) to the output buffer 6 of the input/output port 16, an output test signal SO (or an output voltage signal ASO) is repeatedly output from the output buffer 6 of the input/output port 16 and is input to the output buffer 6 of a succeeding input/output port 4 as an input test signal SI (or a voltage control signal ASI). Thereafter, in the same manner, as shown in FIG. 2, the input test signal SI (or the voltage control signal ASI) is repeatedly input from the output buffer 6 of the preceding input/output port 4 to the output buffer 6 of the current input/output port 4, and an output test signal SO (or an output voltage signal ASO) is repeatedly output from the output buffer 6 of the current input/output port 4 and is input to the output buffer 6 of a succeeding input/output port 4 as an input test signal SI (or a voltage control signal ASI). Thereafter, the input test signal SI is repeatedly input from the output buffer 6 of the input/output port 4 to the output buffer 6 of the input/output port 17 arranged in the final stage of the serial chain, and an output test signal SO is output from the output buffer 6 of the input/output port 17. Also, the voltage control signal ASI is repeatedly input from the output buffer 6 of the input/output port 4 to the output buffer 6 of the input/output port 17. In the input/output port 17, no output voltage signal ASO is output. In FIG. 1, 8 indicates a for-wafer-test input/output element which is arranged on one outer circumferential side of the internal circuit area 3 and is exclusively used in the wafer test to output the output test signal SO output from the output buffer 6 of the input/output port 17 to the outside, and 7 indicates a for-wafer-test input/output element which is arranged on one outer circumferential side of the internal circuit area 3 and is exclusively used in the wafer test to output an output voltage signal AIO to the outside.

The output voltage signal AIO is produced in the output buffer 6 of one input/output port 16, 4 or 17 according to the voltage control signal ASI. The for-wafer-test input/output element 8 has an output buffer 23.

Figure 3:
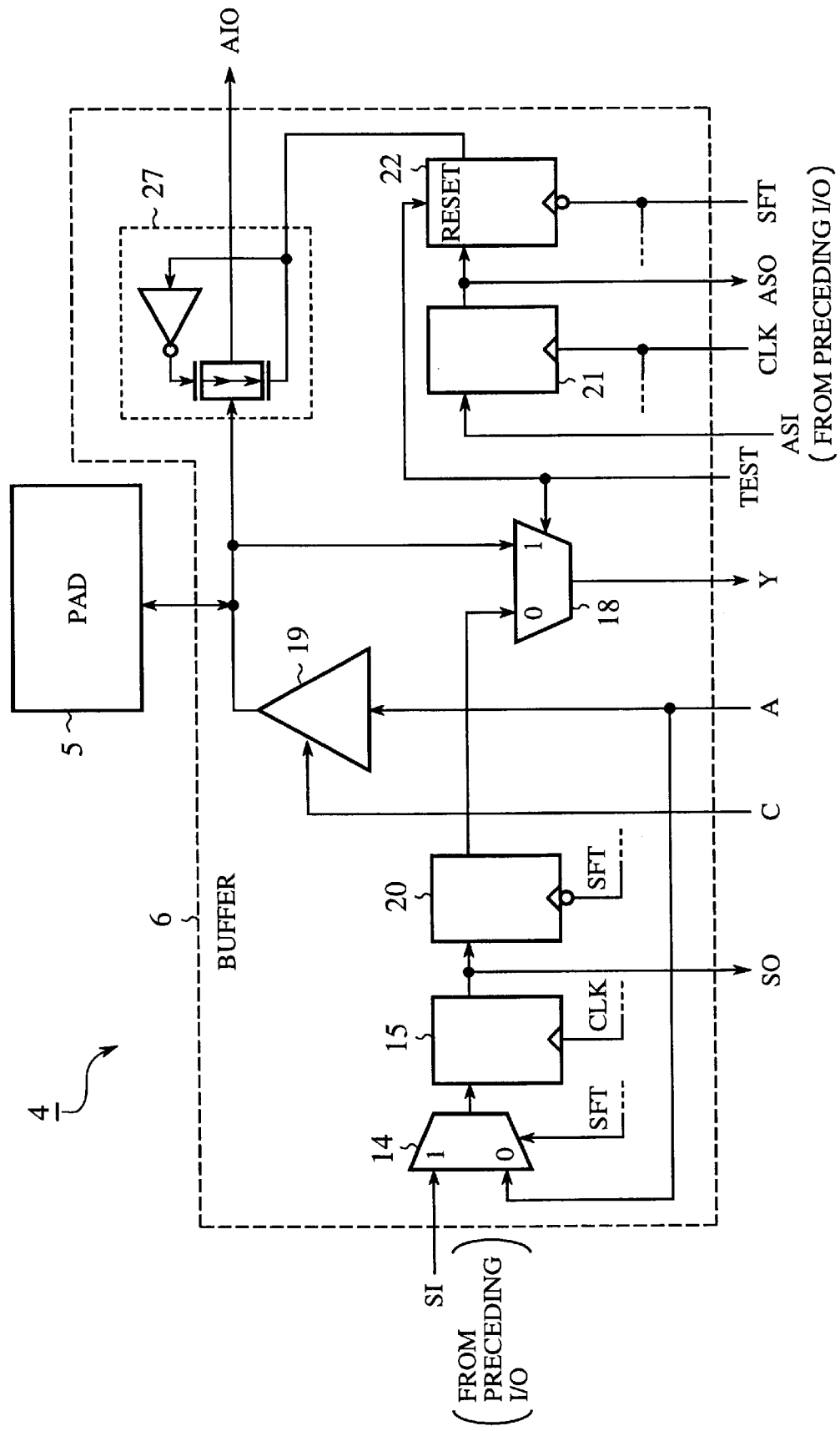
FIG. 3 is a block diagram of the buffer of each input/output port shown in FIG. 1.

FIG. 3 is a block diagram of the buffer 6 of each input/output port 4, 16 or 17 shown in FIG. 1. In FIG. 3, 19 indicates an output buffer for inputting an output signal A produced in the internal circuit and outputting the output signal A to the pad 5 according to a control signal C in a normal operation. 18 indicates a selector for selecting either an input signal received in the pad 5 in the normal operation or the input test signal SI input to the buffer 6 in the wafer test according to the for-wafer-test control signal TEST. 14 indicates a selector for selecting either the input test signal SI, which is output from the preceding input/output port 4 or 16 or the for-wafer-test input/output element 10, or an output signal A produced in the internal circuit according to the shift clock signal SFT in the wafer test. 15 indicates a shift register (or a first shift register) for holding the output signal A selected in the selector 14, holding the input test signal SI selected in the selector 14, outputting the output signal A as the output test signal SO according to the clock signal CLK each time the output signal A selected in the selector 14 is received and outputting the input test signal SI according to the clock signal CLK each time the input test signal SI selected in the selector 14 is received. 20 indicates a register for holding the input test signal SI output from the shift register 15 and outputting the input test signal SI to the selector 18 according to the shift clock signal SFT. 21 indicates a sift register (or a second shift register) for holding the voltage control signal ASI, which is output from the preceding input/output port 4 or 16 as the output voltage signal ASO or the for-wafer-test input/output element 9, in the wafer test and outputting the voltage control signal ASI as the output voltage signal ASO according to the clock signal CLK each time the voltage control signal ASI is received. 22 indicates a register for holding the voltage control signal ASI output from the shift register 21 and outputting the voltage control signal ASI according to the shift clock signal SFT. 27 indicates a switch in which an on/off control is performed according to the voltage control signal ASI output from the register 22 and outputting an output voltage signal AIO indicating a value of the voltage applied to the pad 5 according to the voltage control signal ASI output from the register 22.

In the above configuration, a normal operation and a wafer test operation performed in the semiconductor integrated circuit are described.

The for-wafer-test input/output elements 9 to 13 are pulled up in a normal operation, so that the signals ASI, SI, SFT, CLK and TEST used for only the wafer test are respectively fixed to a high ("H") level.

The normal operation performed after the wafer test in the semiconductor integrated circuit is initially described. The pad 5 of each input/output port 4, 16 or 17 is connected with a boding wire. In each input/output port 4, 16 or 17, in cases where a control signal C produced in the corresponding internal circuit is set to a low "L" level, the output buffer 19 is set to a high impedance state, so that no signal passes through the output buffer 19. In this case, because the for-wafer-test control signal TEST is set to the "H" level, an input signal Y received in the pad 5 passes through the selector 18 and is input to the internal circuit (for example, a logical circuit). Therefore, a logical calculation is performed in the internal circuit according to the input signal Y, and an output signal A is produced in the internal circuit. Thereafter, in cases where the control signal C is set to the "H" level, the output signal A passes through the output buffer 19, the pad 5 and the bonding wire and is output to an external apparatus (not shown).

Next, a wafer test, which is performed in the input/output ports 4, 16 and 17 to check the functions of the internal circuits before the normal operation described above is performed, is described.

In cases where a wafer test is performed for the internal circuits corresponding to the input/output ports 4, 16 and 17, each of the for-wafer-test input/output elements 8, 10, 11, 12 and 13 is connected with a probe, the for-wafer-test control signal TEST is set to the "L" level. Therefore, no input signal Y sent from the pad 5 is selected in the selector 18 of each input/output port 4, 16 or 17, but a signal sent from the register 20 is selected in the selector 18 of each input/output port 4, 16 or 17. Also, the control signal C is set to the "L" level. Also, a plurality of input test signals SI (also called a plurality of input test signals SI(i), and i=1,2, - - - , n), of which the number is equal to the number of all input/output ports 4, 16 and 17, are prepared to be serially input to the for-wafer-test input/output element 10 through the probe, and the shift clock signal SFT initially set to the "H" level is sent from the for-wafer-test input/output element 11 to the selector 14 and the register 20 of each input/output port 4, 16 or 17. Because the shift clock signal SFT input to the selectors 14 and the registers 20 is set to the "H" level, the input test signal SI is selected in each selector 14, and the shifting of a signal from the shift register 15 to the register 20 is prohibited in each input/output port 4, 16 or 17.

Thereafter, a pulse of the clock signal CLK is repeatedly input to the shift register 15 of each input/output port 4, 16 or 17 through the for-wafer-test input/output element 12. Therefore, the input test signal SI(1) sent from the for-wafer-test input/output element 10 is selected in the selector 14 of the input/output port 16 arranged in the first stage of the serial chain and is held in the shift register 15 of the input/output port 16 in response to the first pulse of the clock signal CLK. Thereafter, in response to the second pulse of the clock signal CLK, the input test signal SI(1) held in the shift register 15 of the input/output port 16 is sent as an output test signal SO to the input/output port 4 arranged in the second stage of the serial chain, and the output test signal SO is held in the shift register 15 of the input/output port 4 as an input test signal SI. Also, the input test signal SI(2) sent from the for-wafer-test input/output element 10 passes through the selector 14 of the input/output port 16 and is held in the shift register 15 of the input/output port 16 in response to the second pulse of the clock signal CLK. This operation is performed for each clock signal. That is, the shifting of the input test signal SI, which is held in the shift register 15 of each input/output port 16 or 4, to the shift register 15 of the succeeding input/output port 4 or 17 and the holding of the input test signal SI, which is input from the for-wafer-test input/output element 10, in the shift register 15 of the input/output port 16 are performed each time the pulse of the clock signal CLK is input to the shift registers 15 of the input/output ports 4, 16 and 17. Therefore, when the input test signal SI(n) is finally held in the shift register 15 of the input/output port 16, the input test signal SI(1) is held in the shift register 15 of the input/output port 17 arranged in the final stage of the serial chain, the input test signal SI(2) is held in the shift register 15 of the input/output port 4 preceding to the input/output port 17 in the serial chain, and each input test signal SI(j) (j=3,4, - - - , n−1) is held in the shift register 15 of the input/output port 4 arranged in the (n+1−j)-th stage of the serial chain.

When the test signals SI are held in the shift registers 15 of all the input/output ports 4, 16 and 17, the shift clock signal SFT changed to the "L" level is sent from the for-wafer-test input/output element 11 to the selectors 14 and the registers 20 of all the input/output ports 4, 16 and 17. Because the shift clock signal SFT input to the selectors 14 and the registers 20 is set to the "L" level, the input test signal SI held in the shift register 15 of each input/output port 4, 16 or 17 can be shifted to the corresponding register 20, and a signal A produced in the internal circuit can be selected in the selector 14 of each input/output port 4, 16 or 17.

Thereafter, a pulse of the clock signal CLK is input to the shift register 15 of each input/output port 4, 16 or 17 through the for-wafer-test input/output element 12. Therefore, in response to the pulse of the clock signal CLK, the input test signal SI held in the shift register 15 of each input/output port 4, 16 or 17 is shifted to the corresponding register 20, the input test signal SI held in the register 20 is input to the corresponding internal circuit (for example, a logical circuit) through the selector 18, a logical calculation is performed in the internal circuit according to the input test signal SI to produce an output signal A, and the output signal A is held in the shift register 15 through the corresponding selector 14.

When the output signal A is held in the shift registers 15 of all the input/output ports 4, 16 and 17, a plurality of input test signals SI (also called a plurality of input test signals SI(i), and i=1,2, - - - , n), of which the number is equal to the number of all input/output ports 4, 16 and 17, are again prepared to be serially input to the for-wafer-test input/output element 10, and the shift clock signal SFT changed to the "H" level is sent from the for-wafer-test input/output element 11 to the selectors 14 and the registers 20 of all the input/output ports 4, 16 and 17. Thereafter, a pulse of the clock signal CLK is repeatedly input to the shift register 15 of each input/output port 4, 16 or 17 through the for-wafer-test input/output element 12. Therefore, the output signal A held in the shift register 15 of each input/output port 4 or 16 is shifted to the shift register 15 of the succeeding input/output port 4 or 17 each time the pulse of the clock signal CLK is input to the shift register 15 of each input/output port 4 or 16, and the output signal A held in the shift register 15 of the input/output port 17 is shifted to the for-wafer-test input/output element 8 each time the pulse of the clock signal CLK is input to the shift register 15 of the input/output port 17. Therefore, the output signals A initially held in the shift registers 15 of all the input/output ports 4, 16 and 17 are serially output to the for-wafer-test input/output element 8 as a plurality of output test signals SO.

Also, the input test signal SI sent from the for-wafer-test input/output element 10 is held in the shift register 15 of the input/output port 16 each time the pulse of the clock signal CLK is input to the shift register 15 of the input/output port 16, the input test signal SI held in the shift register 15 of the input/output port 16 is shifted to the shift register 15 of the input/output port 4 succeeding to the input/output port 16 in the serial chain each time the pulse of the clock signal CLK is input to the shift registers 15 of the input/output ports 4 and 16, and the input test signal SI held in the shift register 15 of the input/output port 4 is shifted to the shift register 15 of the input/output port 4 or 17 succeeding to the input/output port 4 in the serial chain each time the pulse of the clock signal CLK is input to the shift registers 15 of the input/output ports 4 and 17. Therefore, the input test signals SI are finally held in the shift registers 15 of all the input/output ports 4, 16 and 17 in place of the output signals A.

Accordingly, in the wafer test, each input test signal SI is input to one internal circuit of the semiconductor integrated circuit through the corresponding input/output port 4, 16 or 17, one output signal A is produced from the input test signal SI in each internal circuit of the semiconductor integrated circuit, and the output signals A are serially output from the semiconductor integrated circuit as a plurality of output test signals SO. Therefore, the functions of the internal circuits can be checked by analyzing the output test signals SO in an external apparatus (not shown).

Also, no probe is connected with each of the input/output ports 4, 16 and 17 in the wafer test, but a plurality of probes are connected with the for-wafer-test input/output elements 8, 10, 11, 12 and 13 in the wafer test. Therefore, the pads 5 of all the input/output ports 4, 16 and 17 receive no physical damage in the wafer test.

Next, the measurement of a value of the voltage applied to a specific input/output port 4, 16 or 17 in the wafer test is described. The pad 5 of the specific input/output port 4, 16 or 17 denotes a for-voltage-supply pad.

In cases where a value of the voltage applied to the specific input/output port 4, 16 or 17 is measured, each of the for-wafer-test input/output elements 7, 9, 11, 12 and 13 is connected with a probe, and the for-wafer-test control signal TEST set to the "L" level is input from the for-wafer-test input/output element 13 to the register 22. Also, a plurality of voltage control signals ASI (also called a plurality of voltage control signals ASI(i), and i=1,2, - - - , n), of which the number is equal to the number of all input/output ports 4, 16 and 17, are prepared to be serially input to the for-wafer-test input/output element 9 through the probe, and the shift clock signal SFT initially set to the "H" level is sent from the for-wafer-test input/output element 11 to the register 22 of each input/output port 4, 16 or 17. Because the shift clock signal SFT input to the registers 22 is set to the "H" level, the shifting of a signal from the shift register 21 to the register 22 is prohibited in each input/output port 4, 16 or 17.

Thereafter, a pulse of the clock signal CLK is repeatedly input to the shift register 21 of each input/output port 4, 16 or 17 through the for-wafer-test input/output element 12. Therefore, the voltage control signal ASI(1) sent from the for-wafer-test input/output element 9 is held in the shift register 21 of the input/output port 16 in response to the first pulse of the clock signal CLK. Thereafter, in response to the second pulse of the clock signal CLK, the voltage control signal ASI(1) held in the shift register 21 of the input/output port 16 is sent to the input/output port 4 arranged in the second stage of the serial chain as an output voltage control signal ASO(1), and the output voltage control signal ASO(1) is held in the shift register 21 of the input/output port 4 as the voltage control signal ASI(1). Also, the voltage control signal ASI(2) sent from the for-wafer-test input/output element 9 is held in the shift register 21 of the input/output port 16 in response to the second pulse of the clock signal CLK. This operation is performed for each clock signal. That is, the shifting of the voltage clock signal ASI, which is held in the shift register 21 of each input/output port 16 or 4, to the shift register 21 of the succeeding input/output port 4 or 17 and the holding of the voltage control signal ASI, which is input from the for-wafer-test input/output element 9, in the shift register 21 of the input/output port 16 are performed each time the pulse of the clock signal CLK is input to the shift registers 21 of the input/output ports 4, 16 and 17. Therefore, when the voltage control signal ASI(n) is finally held in the shift register 21 of the input/output port 16, the voltage control signal ASI(1) is held in the shift register 21 of the input/output port 17 arranged in the final stage of the serial chain, the voltage control signal ASI(2) is held in the shift register 21 of the input/output port 4 preceding to the input/output port 17 in the serial chain, and each voltage control signal ASI(j) (j=3,4, - - - , n−i) is held in the shift register 21 of the input/output port 4 arranged in the (n+1−j)-th stage of the serial chain.

When the voltage control signals ASI are held in the shift registers 21 of all the input/output ports 4, 16 and 17, the shift clock signal SFT changed to the "L" level is sent from the for-wafer-test input/output element 11 to the registers 22 of all the input/output ports 4, 16 and 17. Because the shift clock signal SFT input to the registers 22 is set to the "L" level, the voltage control signal ASI held in the shift register 21 of each input/output port 4, 16 or 17 can be shifted to the corresponding register 22.

Thereafter, a pulse of the clock signal CLK is input to the shift register 21 of each input/output port 4, 16 or 17 through the for-wafer-test input/output element 12. Therefore, in response to the pulse of the clock signal CLK, the voltage control signal ASI held in the shift register 21 of each input/output port 4, 16 or 17 is shifted to the corresponding register 22, and the voltage control signal ASI held in the register 22 is input to the switch 27. In this case, the switch 27 of each input/output port 4, 16 or 17 is set to an "on" state in cases where the voltage control signal ASI input to the switch 27 is set to the "H" level. In contrast, the switch 27 is set to an "off" state in cases where the voltage control signal ASI input to the switch 27 is set to the "L" level. Therefore, in cases where a specific voltage control signal ASI held in the register 22 of the specific input/output port 4, 16 or 17 is set to the "H" level, the switch 27 of the specific input/output port 4, 16 or 17 is set to the "on" state, and an output voltage signal AIO indicating a value of the voltage applied to the pad 5 of the specific input/output port 4, 16 or 17 is sent from the pad 5 to the for-wafer-test input/output element 7 through the switch 27. Also, in cases where other voltage control signals ASI held in the registers 22 of input/output ports 4, 16 and 17 other than the specific input/output port 4, 16 or 17 are respectively set to the "L" level, the switches 27 of the input/output ports 4, 16 and 17 other than the specific input/output port 4, 16 or 17 are respectively set to the "off" state, and no signal is sent from each of the input/output ports 4, 16 and 17 other than the specific input/output port 4, 16 or 17 to the for-wafer-test input/output element 7.

Therefore, the for-wafer-test input/output element 7 receives only the output voltage signal AIO indicating a value of the voltage applied to the pad 5 of the specific input/output port 4, 16 or 17, and the output voltage signal AIO is output to an external apparatus (not shown). Accordingly, the value of the voltage applied to the pad 5 of the specific input/output port 4, 16 or 17 can be measured in advance in the wafer test.

The specific input/output port 4, 16 or 17 is normally a for-voltage-supply input/output port having a for-voltage-supply pad 5.

Figure 4:
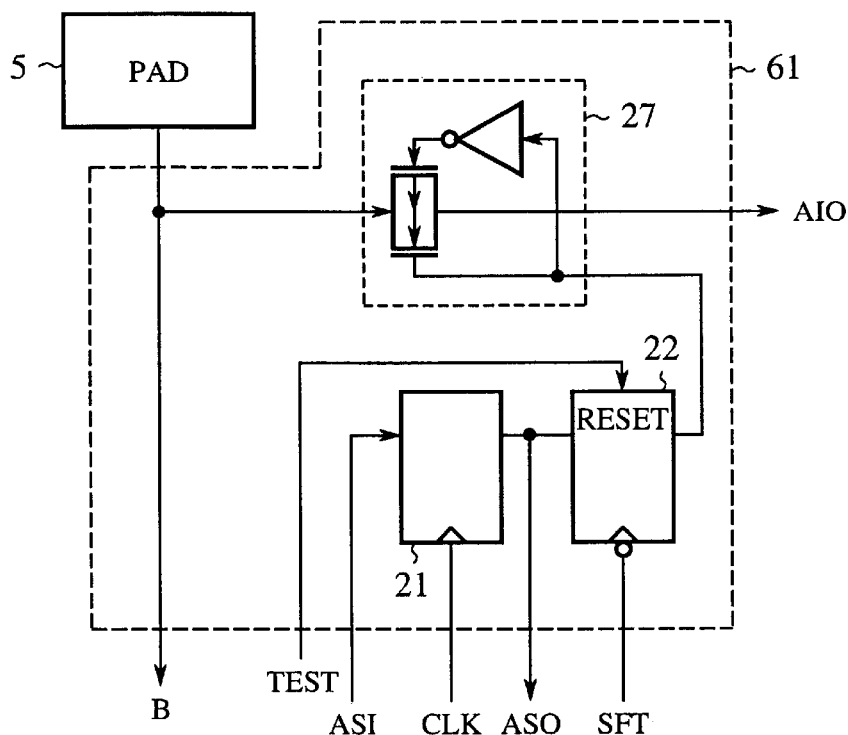
FIG. 4 is a block diagram of a for-voltage-supply input/output port having a for-voltage-supply pad.

FIG. 4 is a block diagram of a for-voltage-supply input/output port having a for-voltage-supply pad 5. As shown in FIG. 4, because an internal circuit corresponding to the for-voltage-supply input/output port is not a logical circuit, a wafer test for checking the function of a logical circuit is not required in the for-voltage-supply input/output port, so that a group of the selector 14, the shift register 15, the selector 18, the output buffer 19 and the register 20 shown in FIG. 3 is not required in the for-voltage-supply input/output port. Therefore, an output buffer 61 of the for-voltage-supply input/output port comprises the shift register 21, the register 22 and the switch 27.

When a voltage is applied to the pad 5 of the for-voltage-supply input/output port, an electric power is supplied to the corresponding internal circuit different from a logical circuit in the normal operation. In cases where an operator desires to measure the voltage value in advance in the wafer test, the measurement of the voltage value is performed in the same manner as that performed for the specific input/output port 4, 16 or 17.

That is, the for-wafer-test control signal TEST set to the "L" level and the shift clock signal SFT set to the "H" level are input to the register 22 of each of the input/output ports 4, 16 and 17 including the for-voltage-supply input/output port, and a plurality of voltage control signals ASI, of which the number is equal to the number of all input/output ports 4, 16 and 17, are serially input to the shift register 21 of each input/output port 4, 16 or 17 while inputting each of pulses of the clock signal CLK to the shift registers 21 of the input/output ports 4, 16 and 17. Therefore, the voltage control signals ASI are held in the shift registers 21 of the input/output ports 4, 16 and 17. Thereafter, a pulse of the clock signal CLK is input to the shift registers 21, and the voltage control signals ASI of the shift registers 21 are shifted to the registers 22. In this case, the specific voltage control signal ASI held in the register 22 of the for-voltage-supply input/output port is only set to the "H" level, and the voltage control signals ASI held in the other registers 22 are respectively set to the "L" level. Therefore, the switch 27 of the for-voltage-supply input/output port is only set to the "on" state according to the specific voltage control signal ASI, and an output voltage signal AIO indicating the value of the voltage applied to the pad 5 of the for-voltage-supply input/output port is sent to an external apparatus through the for-wafer-test input/output element 7.

Accordingly, in the first embodiment, because the input test signals SI, the shift clock signals SFT, the clock signal CLK and the for-wafer-test control signal TEST are input to the buffers 6 of the input/output ports 4, 16 and 17 through the for-wafer-test input/output elements 10 to 13 connected with the probes and because the output test signals SO produced in the internal circuits (or the logical circuits) is obtained through the for-wafer-test input/output element 8 connected with the probe, the functions of the internal circuits can be checked in the wafer test without connecting each of the input/output ports 4, 16 and 17, which are to be connected with bonding wires in the normal operation, with a probe in the wafer test. Therefore, because no probe is connected with each of the input/output ports 4, 16 and 17 in the wafer test, each of the pads 5 of all the input/output ports 4, 16 and 17 receive no physical damage in the wafer test, a contact failure between a bonding wire and the pad 5 of each input/output port 4, 16 or 17 can be prevented in the connection of the bonding wire with the pad 5 performed in the normal operation after the wafer test, and the yield of the semiconductor integrated circuit can be improved.

Also, because a set of for-wafer-test input/output elements 8, 10, 11, 12 and 13 exclusively used in the wafer test is arranged in the semiconductor integrated circuit to check the functions of the internal circuits corresponding to the input/output ports in the wafer test, a size of the semiconductor integrated circuit can be made small as compared with a case where a for-wafer-test input/output element exclusively used in the wafer test is arranged for each input/output port used in the normal operation. Therefore, the increase of the size of the semiconductor integrated circuit having the internal circuits can be suppressed.

Also, in the first embodiment, because the voltage control signals ASI are input to the buffers 6 of the input/output ports 4, 16 and 17 through the for-wafer-test input/output element 9 connected with the probe and because the output voltage signal AIO produced in the specific for-voltage-supply input/output port 4, 16 or 17 is obtained through the for-wafer-test input/output element 7 connected with the probe, the value of the voltage supplied to the pad 5 of the specific for-voltage-supply input/output port 4, 16 or 17 can be measured without damaging each of the pads 5 of all the input/output ports 4, 16 and 17 including the specific for-voltage-supply input/output port 4, 16 or 17. Therefore, even though the value of the voltage supplied to the pad 5 of the specific for-voltage-supply input/output port 4, 16 or 17 is measured, a contact failure between a bonding wire and the pad 5 of each input/output port 4, 16 or 17 can be prevented in the connection of the bonding wire with the pad 5 performed in the normal operation.

In the first embodiment, each input/output port 4, 16 or 17 has the shift register 21, the register 22 and the switch 27 to measure the value of the voltage applied to the pad 5 of the input/output port 4, 16 or 17. However, in cases where it is not required to measure the value of the voltage applied to the pad 5 in an input/output port 4, 16 or 17, the group of the shift register 21, the register 22 and the switch 27 is not required in the input/output port 4, 16 or 17.

EMBODIMENT 2

There is a case where a particular signal (for example, a system clock signal), in which the frequency of a level change is high (or a frequency is high), is received in a particular input/output port 4, 16 or 17 in the normal operation to transmit the particular signal to a particular internal circuit though a signal, in which the frequency of a level change is low (or a frequency is low), is received in each of the other input/output ports 4, 16 and 17 in the normal operation to transmit the signal to the corresponding internal circuit. In this case, assuming that the input test signals SI are input to all the input/output ports 4, 16 and 17 of the serial chain in the wafer test according to the first embodiment, there is a case where a level of a particular input test signal SI corresponding to the particular input/output port 4, 16 or 17 is changed though each of the levels of the other input test signals SI is not changed, so that it is required that the particular input test signal SI corresponding to the particular input/output port 4, 16 or 17 is reset to have a high frequency though the other input test signals SI are respectively maintained to a low frequency. Therefore, it is required to reset an entire test pattern of all the input test signals SI serially arranged with each other, so that it takes a long time to perform the wafer test for the semiconductor integrated circuit having the particular input/output port 4, 16 or 17.

In a second embodiment, a particular input/output port is provided for a particular internal circuit in which a system clock signal of a high frequency is used.

Figure 5:
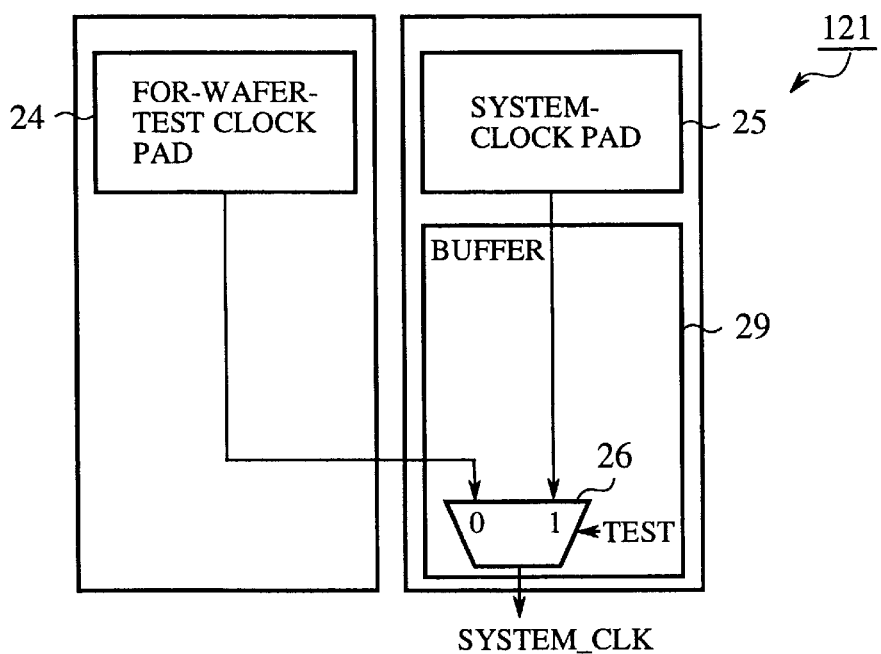
FIG. 5 is a block diagram of a particular input/output port, in which a high frequency signal is received in the normal operation to transmit the high frequency signal to an internal circuit corresponding to the particular input/output port, according to a second embodiment of the present invention.

FIG. 5 is a block diagram of a particular input/output port, in which a high frequency signal is received in the normal operation to transmit the high frequency signal to an internal circuit corresponding to the particular input/output port, according to a second embodiment of the present invention. In FIG. 5, 121 indicates a particular input/output port from which a system clock signal of a high frequency is transmitted to a particular internal circuit in the normal operation. 25 indicates a system clock pad for receiving the system clock signal in the normal operation. 24 indicates a for-wafer-test-clock pad for receiving a for-wafer-test-clock signal having the same high frequency as that of the system clock signal in the wafer test. 29 indicates an output buffer of the particular input/output port 121. 26 indicates a selector for selecting either the system clock signal or the for-wafer-test-clock signal according to the for-wafer-test control signal TEST transmitted from the for-wafer-test input/output element 13.

In the above configuration, an operation of the particular input/output port 121 is described.

A serial chain is composed of the input/output ports 4, 16 and 17 other than the particular input/output port 121, and the wafer test is performed for the serial chain in the same manner as in the first embodiment by using the input test signals SI, the shift clock signals SFT, the clock signal CLK, the for-wafer-test control signal TEST and the output test signals SO input/output through the for-wafer-test input/output elements 8, 10, 11, 12 and 13.

Also, to check the function of a particular internal circuit corresponding to the particular input/output port 121, a wafer test is performed by using the particular input/output port 121. In detail, the for-wafer-test clock pad 24 is connected with a probe in the wafer test to input the for-wafer-test-clock signal SYSTEM-CLK to the for-wafer-test-clock pad 24 through the probe, and the for-wafer-test control signal TEST set to the "L" level is sent to the selector 26 of the output buffer 29 of the particular input/output port 121 through the for-wafer-test input/output element 13. Therefore, the for-wafer-test-clock signal SYSTEM-CLK input to the for-wafer-test-clock pad 24 is selected in the selector 26 according to the for-wafer-test control signal TEST, and the for-wafer-test-clock signal SYSTEM-CLK is input to the particular internal circuit. Therefore, the function of the particular internal circuit can be checked.

Thereafter, when a normal operation is performed, the system clock pad 25 is connected with a boding wire to input the system clock signal to the system clock pad 25 through the bonding wire, and the for-wafer-test control signal TEST changed to the "H" level is sent to the selector 26 through the for-wafer-test input/output element 13. Therefore, the system clock signal input to the system clock pad 25 is selected in the selector 26 according to the for-wafer-test control signal TEST, and the system clock signal is input to the particular internal circuit. Therefore, the particular internal circuit can be operated according to the system clock signal in the normal operation.

Accordingly, in the second embodiment, because the wafer test for the particular internal circuit corresponding to the particular input/output port 121 is performed separately from the wafer test for the internal circuits other than the particular internal circuit, even though a system clock signal of a high frequency is required in the particular internal circuit, the resetting of the entire test pattern of the input test signals SI used for the internal circuits other than the particular internal circuit is not required, so that the time required for the wafer test of all the internal circuits including the particular internal circuits can be shortened.
EMBODIMENT 3

In the second embodiment, in cases where a system clock signal of a high frequency is required in the particular internal circuit, because the for-wafer-test-clock pad 24 is additionally arranged, the for-wafer-test input/output element 10 used for the input test signal SI is not used in the wafer test of the particular internal circuit. However, because the for-wafer-test input/output elements 8, 11, 12 and 13 are required in the wafer test of the particular internal circuit, the wafer test for the particular internal circuit corresponding to the particular input/output port 121 cannot be performed simultaneously with the wafer test for the internal circuits other than the particular internal circuit. Therefore, the shortening of the time required for the wafer test of all the internal circuits including the particular internal circuit is not sufficient.

In a third embodiment, another set of for-wafer-test input/output elements 8, 11, 12 and 13 used for the wafer test of one or more particular internal circuits, in which high frequency signals sent through one or more particular input/output ports are required, is arranged separately from the set of for-wafer-test input/output elements 7 to 13 used for the wafer test of the internal circuits other than the particular internal circuits.

In this case, the set of for-wafer-test input/output elements 7 and 9 is used to measure the value of the voltage supplied to each of all the internal circuits including the particular internal circuits.

Accordingly, in the third embodiment, because another set of for-wafer-test input/output elements 8, 11, 12 and 13 is arranged in the semiconductor integrated circuit for the wafer test of the-particular internal circuits, in which high frequency signals are required, separately from the set of for-wafer-test input/output elements 7 to 13 used for the wafer test of the internal circuits other than the particular internal circuits, the wafer test of the particular internal circuits can be performed simultaneously with the wafer test of the internal circuits other than the particular internal circuits. Therefore, the time required for the wafer test of all the internal circuits including the particular internal circuits can be moreover shortened.

Also, the number of test patterns required for the wafer test of the internal circuits other than the particular internal circuits can be reduced, and a transfer time of the test signals serially sent to the input/output ports other than the particular input/output ports can be shortened as compared with that of the test signals serially sent to all the input/output ports.

In the third embodiment, only one set of for-wafer-test input/output elements 8, 11, 12 and 13 is additionally arranged in the input/output port area 2 of the semiconductor integrated circuit as compared with the configuration of the first embodiment. However, in cases where a plurality of sets of particular internal circuits exists in the internal circuit area 3 separately from the set of internal circuits, in which low-frequency signals are required, on condition that the high frequency of signals required in each set of particular internal circuits differs from those required in the other sets of particular internal circuits, it is applicable that a plurality of sets of for-wafer-test input/output elements 8, 11, 12 and 13 be additionally arranged in the input/output port area 2 to simultaneously perform the wafer tests of the plurality of sets of particular internal circuits and the wafer test of the internal circuits other than the particular internal circuits.
EMBODIMENT 4

In cases where a large number of input/output ports 4, 16 and 17 are arranged in the input/output port area 2 of the semiconductor integrated circuit to surround the internal circuits arranged in the internal circuit area 3, because the for-wafer-test input/output elements 7 to 13 are additionally arranged on one outer circumferential side of the input/ output port area 2 according to the first embodiment, it is required to increase the input/output port area 2. Therefore, the size of the semiconductor integrated circuit is undesirably made large.

In a fourth embodiment, to prevent the increase of the input/output port area 2, the for-wafer-test input/output elements 7, 9, 10, 11, 12 and 13 are arranged on one or more corners of the input/output port area 2. Because each of the for-wafer-test input/output elements 7, 9, 10, 11, 12 and 13 has no output buffer and because each of the for-wafer-test input/output elements 7, 9, 10, 11, 12 and 13 is not directly connected with the group of internal circuits, the for-wafer-test input/output elements 7, 9, 10, 11, 12 and 13 can be arranged on one or more corners of the input/output port area 2.

Figure 6:
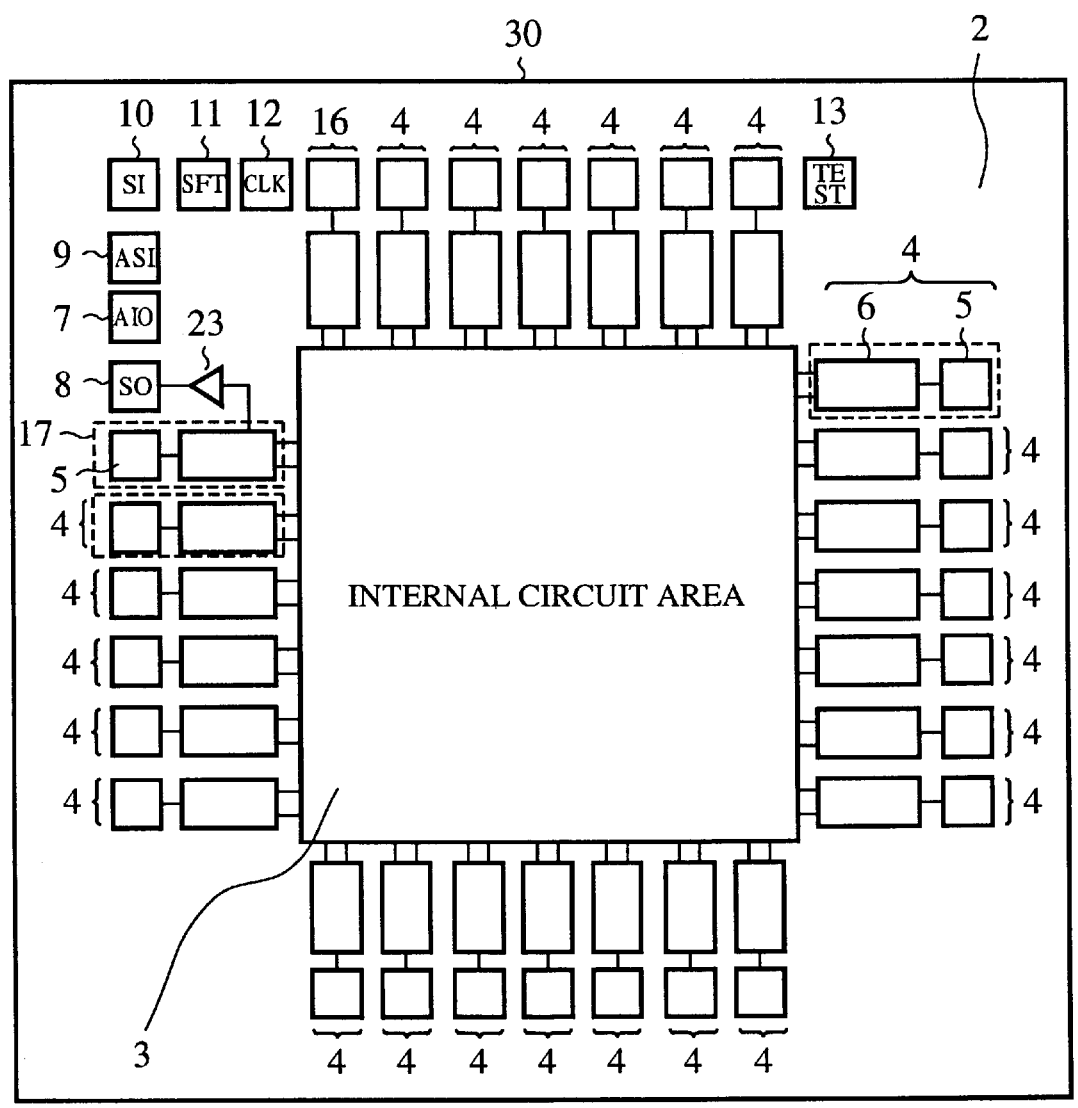
FIG. 6 is a diagram showing a positional relationship among an internal circuit area, a plurality of input/output ports arranged on four outer circumferential sides of the internal circuit area and a plurality of for-wafer-test input/output elements arranged on two corners of a semiconductor chip in a semiconductor integrated circuit according to a fourth embodiment of the present invention.

FIG. 6 is a diagram showing a positional relationship among the internal circuit area 3, the input/output ports 4, 16 and 17 arranged on outer circumferential sides of the internal circuit area 3 and the for-wafer-test input/output elements 7, 9, 10, 11, 12 and 13 arranged on two corners of a semiconductor chip in a semiconductor integrated circuit according to a fourth embodiment of the present invention. In FIG. 6, 30 indicates a semiconductor chip on which a semiconductor integrated circuit is arranged. Composing elements, which are the same as those shown in FIG. 1, are indicated by the same reference signs as those indicating the composing elements shown in FIG. 1.

As shown in FIG. 6, the for-wafer-test input/output elements 7, 9, 10, 11 and 12 are arranged on the above-left corner of the input/output port area 2 to be placed between the input/output ports 16 and 17, and the for-wafer-test input/output element 13 is arranged on the above-right corner of the input/output port area 2.

Accordingly, in the fourth embodiment, because the for-wafer-test input/output elements 7, 9, 10, 11, 12 and 13 are arranged on one or more corners of the input/output port area 2, the size of the semiconductor integrated circuit can be made small as compared with that of the first embodiment.

EMBODIMENT 5

Because the for-wafer-test input/output element 8 shown in FIG. 1 has the output buffer 23, a size of the for-wafer-test input/output element 8 is larger than those of the for-wafer-test input/output elements 7, 9, 10, 11, 12 and 13. Therefore, as shown in FIG. 6, there is a case where the for-wafer-test input/output element 8 cannot be arranged on one corner of the input/output port area 2.

In a fifth embodiment, the output buffer 23 is removed from the for-wafer-test input/output element 8, and an output buffer equivalent to the output buffer 23 is added to the input/output port 17 arranged in the final stage of the serial chain.

Figure 7:
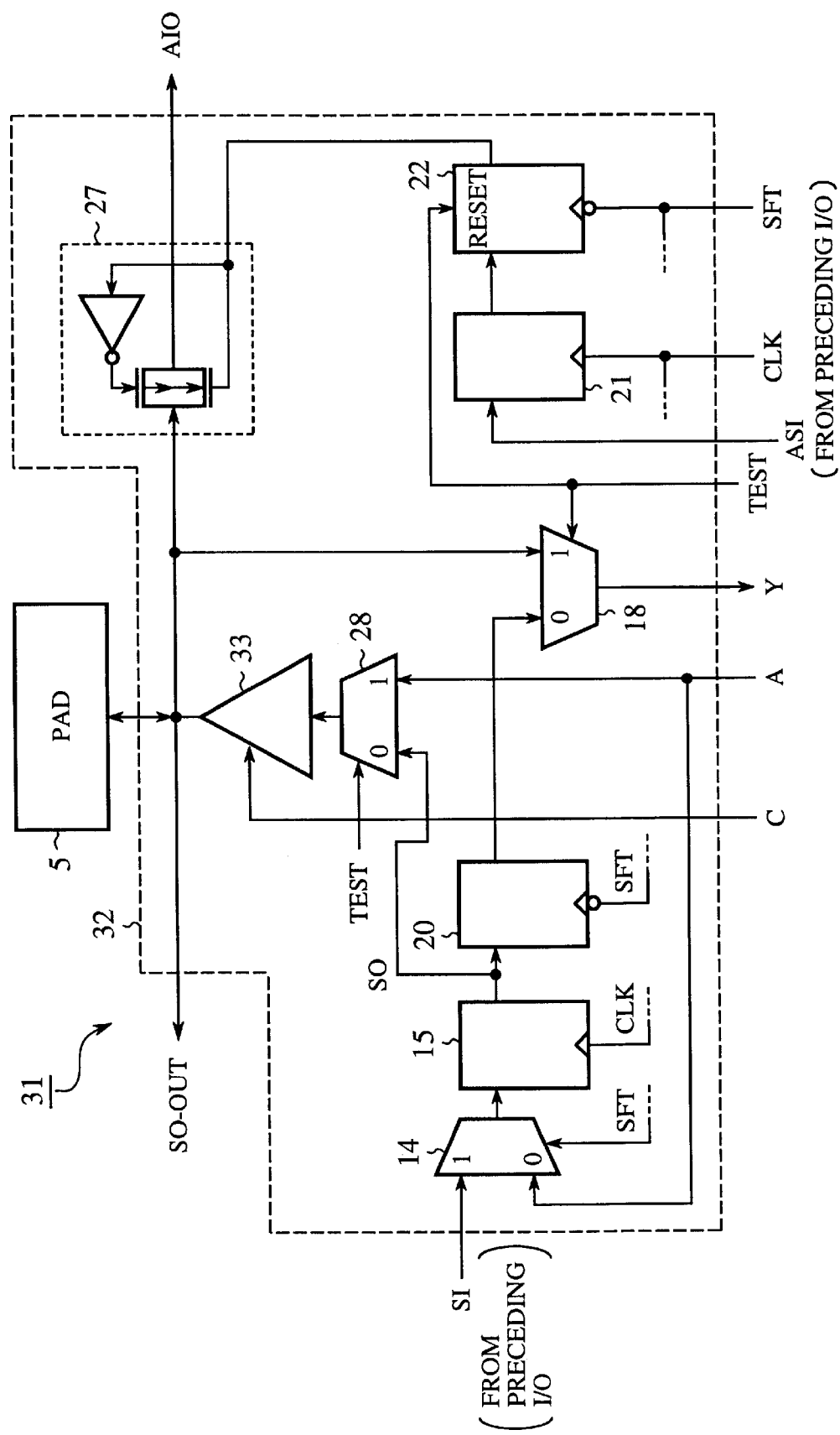
FIG. 7 is a block diagram of a buffer of an input/output port arranged in the final stage of a serial chain according to a fifth embodiment of the present invention.

FIG. 7 is a block diagram of a buffer of an input/output port arranged in the final stage of the serial chain according to a fifth embodiment of the present invention. In FIG. 7, 31 indicates an input/output port arranged in the final stage of the serial chain and is equivalent to the input/output port 17. 32 indicates a buffer of the input/output port 31. 28 indicates a selector for selecting either the output test signal SO or the output signal A produced in the internal circuit according to the for-wafer-test control signal TEST. 33 indicates an output buffer, equivalent to the output buffer 23, for outputting the output test signal SO selected in the selector 28 in the wafer test and outputting the output signal A selected in the selector 28 in the normal operation. The other composing elements, which are the same as those shown in FIG. 3, are indicated by the same reference signs as those indicating the composing elements shown in FIG. 3.

Figure 8:
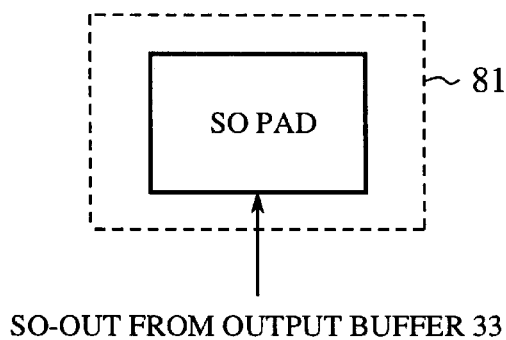
FIG. 8 is a block diagram of a for-wafer-test input/output element for an output test signal according to the fifth embodiment of the present invention

FIG. 8 is a block diagram of a for-wafer-test input/output element for the output test signal SO according to the fifth embodiment of the present invention. In FIG. 8, 81 indicates a for-wafer-test input/output element for receiving the output test signals SO serially output from the shift registers 15 of the input/output ports 4, 16 and 31 through the output buffer 33 and outputting the output test signals SO to an external apparatus (not shown).

In the above configuration, an operation of the input/output port 31 and the for-wafer-test input/output element 81 is described.

In cases where a wafer test is performed, because the for-wafer-test control signal TEST input to the selector 28 is set to the "L" level, the output test signal SO output from the shift register 15 is selected. Therefore, the plurality of output test signals SO are serially output from the shift register 15 in the same manner as in the first embodiment and are serially input to the output buffer 33 through the selector 28. Thereafter, a plurality of output test signals SO-OUT are serially output from the output buffer 33 to the for-wafer-test input/output element 81 and are serially input to an external apparatus (not shown) through a probe connected with an So pad of the for-wafer-test input/output element 81. Therefore, the outputting of the output test signals SO-OUT is performed in the same manner as in the first embodiment.

Also, in cases where a normal operation is performed, because the for-wafer-test control signal TEST input to the selector 28 is set to the "H" level, the output signal A produced in the corresponding internal circuit is selected in the selector 28 and is output to an external apparatus (not shown) through the output buffer 33 and the pad 5 connected with a bonding wire. Therefore, the outputting of the output signal A is performed in the same manner as in the first embodiment.

Accordingly, in the fifth embodiment, because the output buffer 23 used in the for-wafer-test input/output element 8 is removed from the for-wafer-test input/output element 81 and because the output buffer 33 equivalent to the output buffer 23 is arranged in the input/output port 31 arranged in the final stage of the serial chain, a size of the for-wafer-test input/output element 81 can be considerably made small as compared with that of the for-wafer-test input/output element 8, so that the for-wafer-test input/output element 81 can be arranged on one corner of the input/output port area 2 of the semiconductor integrated circuit. Therefore, a size of the semiconductor integrated circuit can be moreover made small as compared with that of the fourth embodiment.

EMBODIMENT 6

Because an input/output port (for example, an input/output port used for an electric power supply), which does not have the output buffer 6 but has only the pad 5, has a small size, the input/output port is arranged on one corner of the input/output port area 2.

Figure 9:
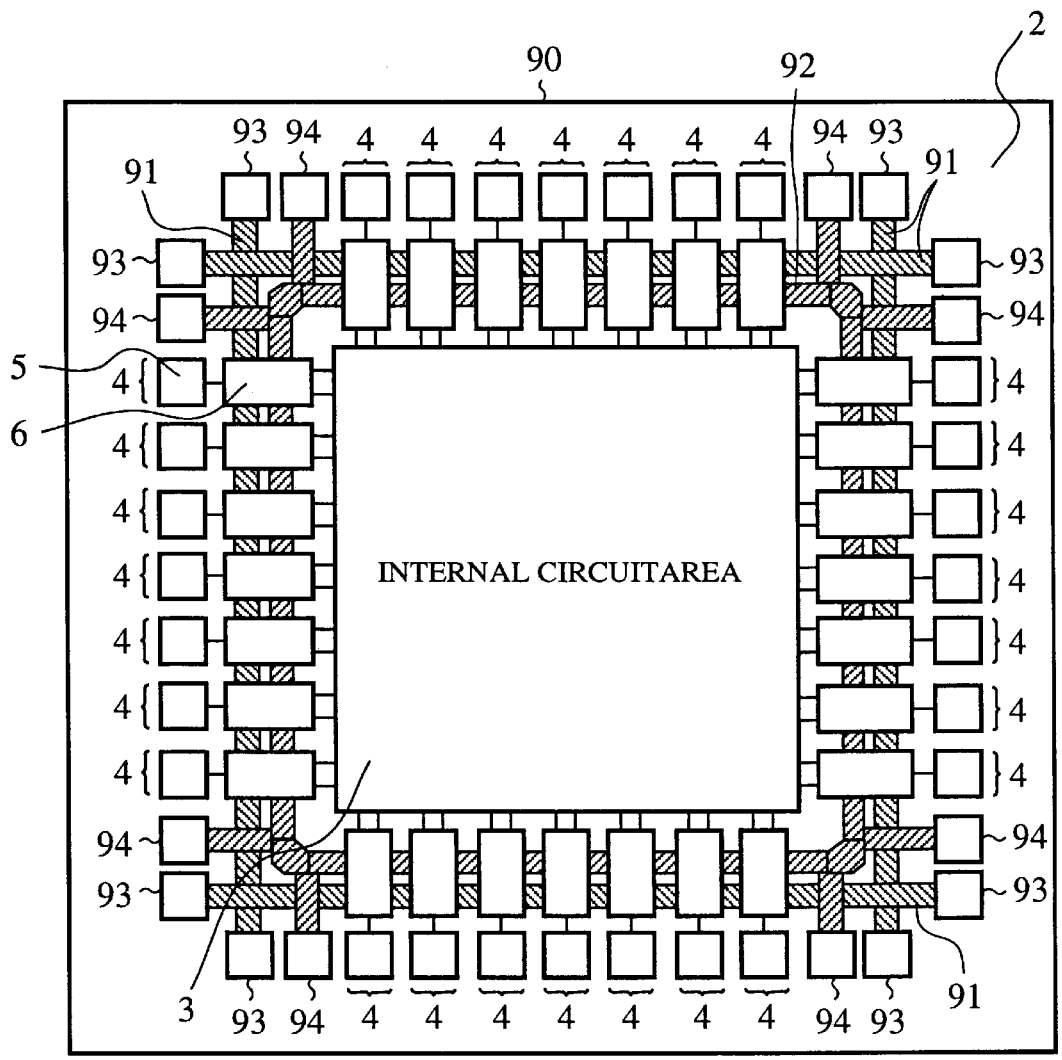
FIG. 9 is a diagram showing a positional relationship among an internal circuit area, a plurality of input/output ports arranged on the four outer circumferential sides of the internal circuit area and a plurality of for-electric-power-supply input/output ports arranged on the four corners of a semiconductor chip in a semiconductor integrated circuit according to a sixth embodiment of the present invention.
Figure 10:
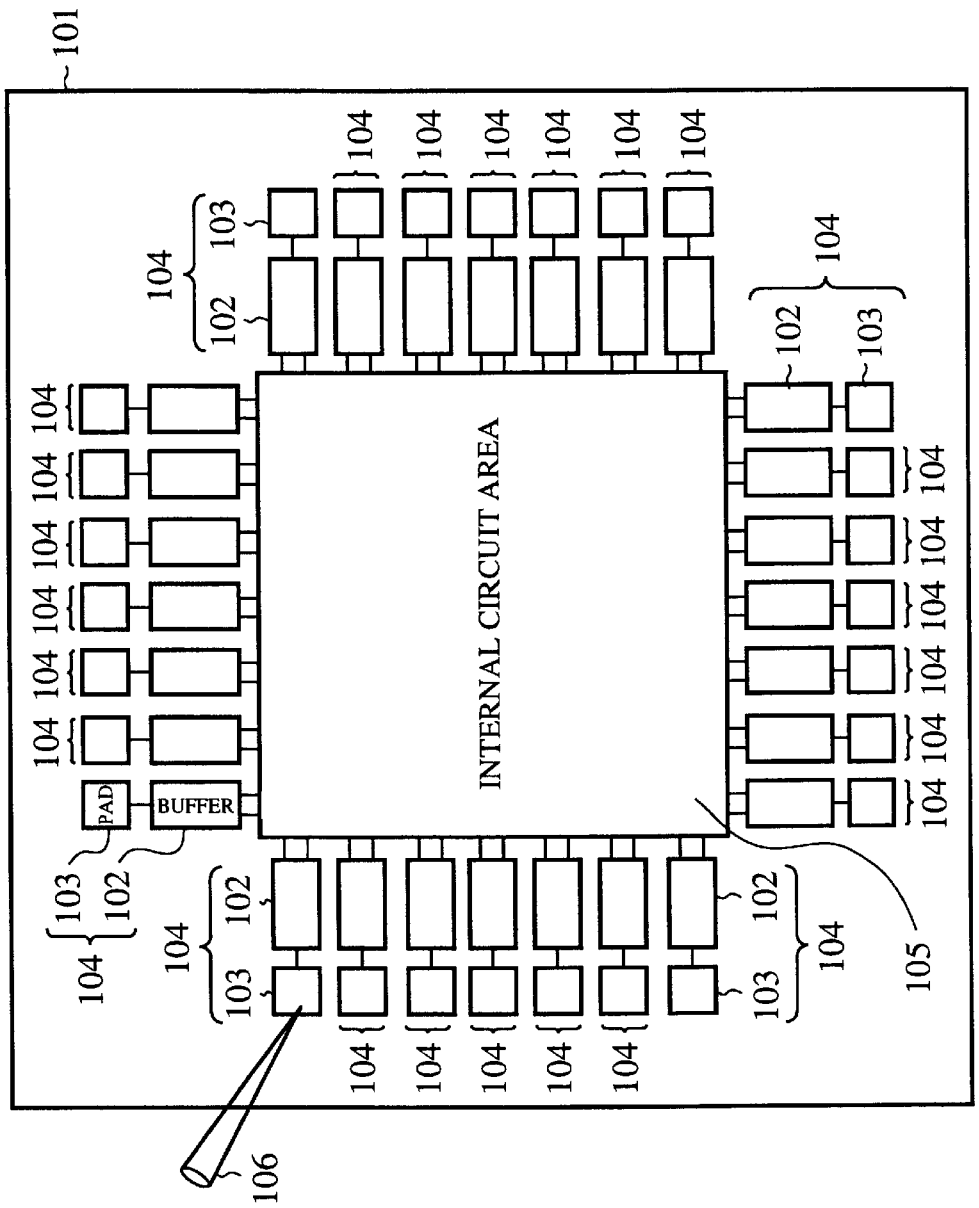
FIG. 10 is a diagram showing a positional relationship among an internal circuit area and a plurality of input/output ports arranged around the internal circuit area in a conventional semiconductor integrated circuit.

FIG. 9 is a diagram showing a positional relationship among the internal circuit area 3, the input/output ports 4 arranged on the four outer circumferential sides of the internal circuit area 3 and a plurality of for-electric-power-supply input/output ports arranged on the four corners of a semiconductor chip in a semiconductor integrated circuit according to a sixth embodiment of the present invention. In FIG. 9, 90 indicates a semiconductor chip on which a semiconductor integrated circuit is arranged. 91 indicates a plurality of VDD power supply lines through which a first electric power voltage VDD is supplied to the input/output ports 4. 92 indicates a plurality of VSS power supply lines through which a second electric power voltage VSS is supplied to the input/output ports 4. 93 indicates a plurality of first for-electric-power-supply input/output ports which each are set to the first electric power voltage VDD and each are connected with the VDD power supply line 91. 94 indicates a plurality of second for-electric-power-supply input/output ports which each are set to the second electric power voltage VSS and each are connected with the VSS power supply line 92. Each first for-electric-power-supply input/output port 93 has only a first for-electric-power-supply pad to which the first electric power voltage VDD is applied, and each second for-electric-power-supply input/output port 94 has only a second for-electric-power-supply pad to which the second electric power voltage VSS is applied. The other composing elements, which are the same as those shown in FIG. 1, are indicated by the same reference signs as those indicating the composing elements shown in FIG. 3.

Because each input/output port 4 is composed of the pad 4 and the output buffer 6, the input/output ports 4 are arranged on the four outer circumferential sides of the internal circuit area 3. In contrast, because each of the first and second for-electric-power-supply input/output ports 93 and 94 has only one pad, a size of each for-electric-power-supply input/output port is small. Therefore, the first and second for-electric-power-supply input/output ports 93 and 94 are arranged on the four corners of the input/output port area 2.

Also, the VDD power supply lines 91 connect the first for-electric-power-supply input/output ports 93 and the output buffers 6 of the input/output ports 4, so that a first electric power voltage VDD is supplied from the first for-electric-power-supply input/output ports 93 to the input/output ports 4. Also, the VSS power supply lines 92 connect the second for-electric-power-supply input/output ports 94 and the output buffers 6 of the input/output ports 4, so that a second electric power voltage VSS is supplied from the second for-electric-power-supply input/output ports 94 to the input/output ports 4. Each of the VDD and VSS power supply lines 91 and 92 is formed of an aluminum wiring-layer. Because the VDD power supply lines 91 cross over the VSS power supply lines 92, no electric short occurs between the group of VDD power supply lines 91 and the group of VSS power supply lines 92.

Therefore, because the first and second electric power voltages VDD and VSS are supplied to each input/output port 4 through the VDD and VSS power supply line 91 and 92, the operation of each input/output port 4 can be performed.

Accordingly, because the first and second for-electric-power-supply input/output ports 93 and 94, which each have only one pad, are arranged on the four corners of the input/output port area 2, the size of the semiconductor integrated circuit can be made small.

What is claimed is:

1. A semiconductor integrated circuit comprising:
   a first for-wafer-test input/output element, exclusively used for a wafer test, for outputting a plurality of test signals to be used in the wafer test;
   a second for-wafer-test input/output element, exclusively used for the wafer test, for outputting a control signal to be used in the wafer test;
   a third for-wafer-test input/output element, exclusively used for the wafer test, for receiving the test signals used in the wafer test; and
   a plurality of input/output ports, which each correspond to an internal circuit and are serially arranged for a flow of the test signals output from the first for-wafer-test input/output element, for receiving the test signals serially output from the first for-wafer-test input/output element, outputting the test signals to the corresponding internal circuits according to the control signal received from the second for-wafer-test input/output element, reading out the test signals from the corresponding internal circuits according to the control signal and serially transferring the test signals to the third for-wafer-test input/output element according to the control signal.

2. A semiconductor integrated circuit according to claim 1, wherein each input/output port comprises a first shift register, the test signals serially output from the first for-wafer-test input/output element are held in the first shift registers of the input/output ports, the test signals held in the first shift registers are output to the corresponding internal circuits according to the control signal received from the second for-wafer-test input/output element, the test signals read out from the corresponding internal circuits according to the control signal are held in the first shift registers, and the test signals held in the first shift registers are transferred to the third for-wafer-test input/output element according to the control signal.

3. A semiconductor integrated circuit according to claim 1, further comprising:
   a fourth for-wafer-test input/output element for outputting a voltage control signal; and
   a fifth for-wafer-test input/output element for receiving an output voltage signal, wherein a specific input/output port selected from the input/output ports comprises:
   a pad to which a voltage is applied; and
   a second shift register for holding the voltage control signal output from the fourth for-wafer-test input/output element in the wafer test according to the control signal received from the second for-wafer-test input/output element to transfer the output voltage signal indicating a value of the voltage applied to the pad to the fifth for-wafer-test input/output element according to the voltage control signal held in the second shift register.

4. A semiconductor integrated circuit according to claim 1, wherein a frequency of a particular test signal, which is selected from the test signals and is output to a particular internal circuit corresponding to a particular input/output port selected from the input/output ports, is higher than that of the other test signals output to the internal circuits other than the particular internal circuit, the particular test signal is sent to the particular input/output port separately from the other test signals sent from the first for-wafer-test input/output element to the input/output ports other than the particular input/output port, and the particular input/output port comprises
   a for-wafer-test pad, exclusively used for a wafer test, for receiving the particular test signal in the wafer test; and
   a selector for selecting the particular test signal received by the for-wafer-test pad or an operation signal according to the control signal received from the second for-wafer-test input/output element to output the particular test signal to the particular internal circuit in the wafer test and to output the operation signal to the particular internal circuit in a normal operation.

5. A semiconductor integrated circuit according to claim 1, further comprising:
   a fourth for-wafer-test input/output element, exclusively used for the wafer test, for outputting a plurality of second test signals of which the frequency is higher than that of the test signals output from the first for-wafer-test input/output element;

a fifth for-wafer-test input/output element, exclusively used for the wafer test, for outputting a second control signal; and a sixth for-wafer-test input/output element, exclusively used for the wafer test, for receiving the second test signals used in the wafer test, wherein the frequency of particular signals, which are required in one or more particular internal circuits selected from the internal circuits, is higher than that of signals required in internal circuits other than the particular internal circuits, the second test signals serially output from the fourth for-wafer-test input/output element are received by one or more particular input/output ports corresponding to the particular internal circuits in place of the test signals serially output from the first for-wafer-test input/output element, the second test signals are output to the particular internal circuits according to the second control signal received from the fifth for-wafer-test input/output element, the second test signals are read out from the particular internal circuits according to the second control signal, and the second test signals are serially transferred to the sixth for-wafer-test input/output element according to the second control signal.

6. A semiconductor integrated circuit according to claim 1, wherein the internal circuits corresponding to the input/output ports are arranged in a central area of the semiconductor integrated circuit, and the first for-wafer-test input/output element and the second for-wafer-test input/output element are arranged on one or more corners of the semiconductor integrated circuit.

7. A semiconductor integrated circuit according to claim 1, wherein a specific input/output port arranged in the final stage among the input/output ports, which are serially arranged for the flow of the test signals serially output from the first for-wafer-test input/output element, has an output buffer required in the third for-wafer-test input/output element while removing the output buffer from the third for-wafer-test input/output element, the internal circuits corresponding to the input/output ports are arranged in a central area of the semiconductor integrated circuit, and the third for-wafer-test input/output element is arranged on a corner of the semiconductor integrated circuit.

8. A semiconductor integrated circuit according to claim 1, further comprising:

a for-electric-power-supply input/output port for supplying an electric power to the input/output ports, wherein the internal circuits corresponding to the input/output ports are arranged in a central area of the semiconductor integrated circuit, and the for-electric-power-supply input/output port is arranged on a corner of the semiconductor integrated circuit.

* * * * *